(12) United States Patent
Rho

(10) Patent No.: US 7,042,782 B2
(45) Date of Patent: May 9, 2006

(54) BIT LINE SENSE AMPLIFIER FOR INHIBITING INCREASE OF OFFSET VOLTAGE

(75) Inventor: Kwang Myoung Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/008,231

(22) Filed: Dec. 10, 2004

(65) Prior Publication Data

US 2005/0213407 A1    Sep. 29, 2005

(30) Foreign Application Priority Data

Mar. 24, 2004    (KR) ............... 10-2004-0019971

(51) Int. Cl.
*G11C 7/00* (2006.01)
(52) U.S. Cl. .................................. 365/205; 365/63
(58) Field of Classification Search ........... 365/205, 365/207, 208, 63
See application file for complete search history.

(56) References Cited

U.S. PATENT DOCUMENTS 6,133,597 A * 10/2000 Li et al. ................. 257/296
6,812,540 B1 * 11/2004 Takaura et al. ......... 257/510

* cited by examiner

*Primary Examiner*—Vu A. Le
(74) *Attorney, Agent, or Firm*—Heller Ehrman LLP

(57) ABSTRACT

A bit line sense amplifier for inhibiting increase of an offset voltage, and a method for fabricating the same are provided. The bit line sense amplifier comprises a plurality of CMOS inverters, which are cross-coupled corresponding to the paired bit lines. Each of the CMOS inverters senses and amplifies a voltage of the paired bit lines. Here, transistors comprised in each inverter are positioned at the same location in a well region where the transistors are formed. As a result, increase of the offset voltage due to inconsistency of electrical characteristics which results from difference in location of devices is inhibited, thereby improving sensitivity of the sense amplifier and characteristics of the DRAM.

3 Claims, 8 Drawing Sheets ions 5, US 7,042,782 B2

BIT LINE SENSE AMPLIFIER FOR INHIBITING INCREASE OF OFFSET VOLTAGE

BACKGROUND ART

1. Field of the Invention

The present invention generally relates to a bit line sense amplifier, and more specifically, to a bit line sense amplifier for inhibiting increase of an offset voltage by offsetting an effect due to characteristic inconsistency of devices which results from difference in space location of devices.

2. Description of the Prior Art

In a DRAM, a sense amplifier as a device for sensing insignificant information stored in a cell and then amplifying the sensed information is positioned in two paired bit lines BL and /BL. However, since the width between the paired bit lines BL and /BL is so narrow that symmetrical NMOS transistors or PMOS transistors are not arranged in parallel but in serial. As a result, the symmetrical NMOS transistors or PMOS transistors which are required to have the same electrical characteristics have relative difference in location to adjacent circuits.

FIG. 1 is a circuit layout diagram illustrating the connection relation ship in a conventional bit line sense amplifier.

Referring to FIG. 1, a NMOS transistor N1 is positioned at the edge of a P-well while a NMOS transistors N2 symmetrically located to the NMOS transistor N1 is positioned at the middle of the p-well. In this way, a relative difference in location of devices which are symmetrically positioned to the adjacent circuits causes an electrical characteristic difference in the two devices, which affects an offset voltage of the bit line sense amplifier comprised of two devices.

FIG. 2 is a diagram illustrating one cause to differentiate a threshold voltage VT depending on location of a device in a well.

In a common ion-implantation process, ions are implanted in a substrate aslant with some angle in a vertical direction of the substrate, and then the substrate is rotated for homogeneous distribution of impurities. Due to the rotation, a part of the ions implanted in the edge of the well are reflected and diffused at a side wall of a photoresist film, and dropped on the substrate. As a result, distribution of concentration of the impurities in the edge of the well is differentiated from that in the middle of the well.

FIG. 3 is a diagram illustrating a simulation result that shows a difference of a local threshold voltage VT of a device depending on location in a well.

As shown in FIG. 3, as closer to the edge of the well, a value of the threshold voltage VT becomes larger.

Since the NMOS transistors N1 and N2 of FIG. 1 are located at a distance of d1 and d2 (d2>d1), respectively, from the edge of the well, the threshold voltage VT of the NMOS transistor N1 is larger than that of the NMOS transistor N2. In the same way, in case of the PMOS transistors P1 and P2, the threshold voltage VT of the PMOS transistors P1 adjacent to the edge of the N-well is larger than that of the PMOS transistor P2.

FIG. 4 is a circuit diagram illustrating the bit line sense amplifier of FIG. 1.

The bit line sense amplifier comprises two CMOS inverters INV1 and INV2 which are cross-coupled. The inverter INV1 is comprised of the NMOS transistor N1 and the PMOS transistor P2, and the inverter INV2 is comprised of the NMOS transistor N2 and the PMOS transistor N1. An output terminal of the inverter INV1 is connected to an input terminal of the inverter INV2, and an output terminal of the inverter INV2 is connected to an input terminal of the inverter INV1. Here, the paired bit lines BL1 and /BL1 are connected to the output terminals of the inverters INV1 and INV2, respectively.

Here, if the NMOS transistor N1 has the same electrical characteristics as those of the NMOS transistor N2 and the PMOS transistor P1 has the same electrical characteristics as those of the PMOS transistor P2, the inverter INV1 has the same characteristics as those of the inverter INV2. As a result, although a small voltage is applied to the paired bit lines BL1 and /BL1, the small voltage can be amplified to a large voltage by a positive feedback of the inverters INV1 and INV2.

However, since the threshold voltages VT of the devices as different from each other as described above, a logic threshold voltage of the inverter INV1 becomes higher and a logic threshold voltage of the inverter INV2 becomes lower, so that the electrical characteristics of the inverter INV1 shift in an opposite direction to those of the inverter INV2.

As a result, the value of the offset voltage in the bit line sense amplifier becomes larger since the threshold voltage VT of the NMOS transistor N1 is added to that of the PMOS transistor P1.

That is, although the same voltage is applied to the paired bit lines BL1 and /BL1, the threshold voltage VT of the NMOS transistor N1 connected to the bit line BL1 is relatively large, so that current leaked into the NMOS transistor N1 is reduced. At the same time, since the threshold voltage VT of the PMOS transistor P2 is relatively small, current flowed from the PMOS transistor P2 is increased, so that the voltage of the bit line BL1 becomes higher gradually. As a result, the voltage of the bit line BL1 is constantly sensed as a high level signal.

As described above, since the offset voltage of the bit line sense amplifier adds to change of characteristics of the symmetrical devices in the arrangement of the devices in the conventional bit line sense amplifier, the offset voltage becomes larger, thereby reducing sensitivity of the bit line sense amplifier.

SUMMARY OF THE INVENTION

Accordingly, it is an object of the present invention to inhibit increase of an offset voltage due to inconsistency of electrical characteristics which results from difference in location of devices by improving arrangement and connection of the devices in a bit line sense amplifier, thereby improving sensitivity of the sense amplifier and characteristics of the DRAM.

In an embodiment, a bit line sense amplifier for inhibiting increase of a offset voltage comprises a plurality of CMOS inverters, which are cross-coupled corresponding to the paired bit lines. Each of the CMOS inverters senses and amplifies a voltage of the paired bit lines. Here, transistors comprised in each inverter are positioned at the same location in a well region where the transistors are formed.

In an embodiment, there is provided a method for fabricating a bit line sense amplifier. When a plurality of CMOS inverters for sensing and amplifying a voltage of paired bit lines, one of the plurality of CMOS inverters is formed by commonly connecting each gate and drain of transistors positioned at the edge of each well region where the transistors comprised in one CMOS inverter are located.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 5:
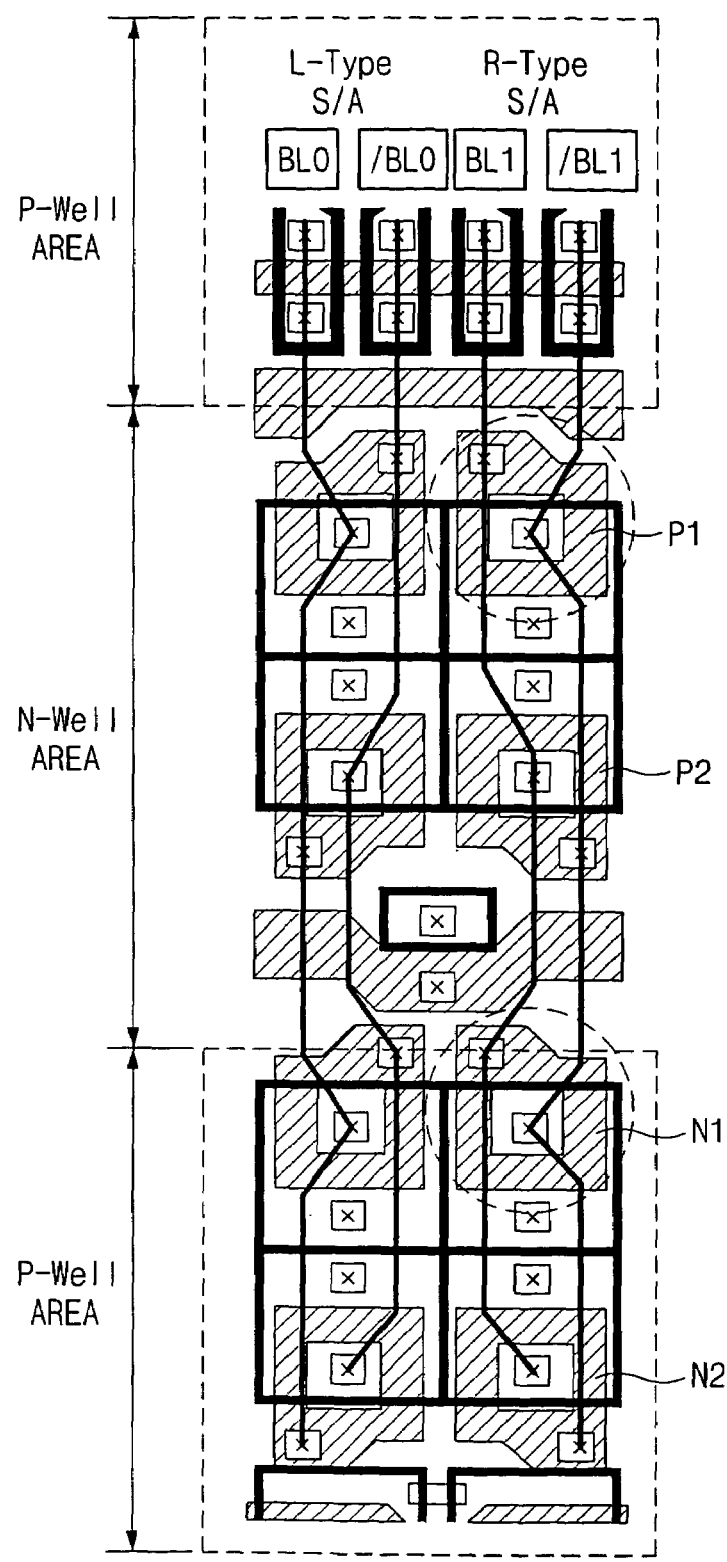
FIG. 5 is a circuit layout diagram illustrating a connection state of a bit line sense amplifier according to an embodiment of the present invention.

FIG. 5 is a circuit layout diagram illustrating a connection state of a bit line sense amplifier according to an embodiment of the present invention.

Figure 1:
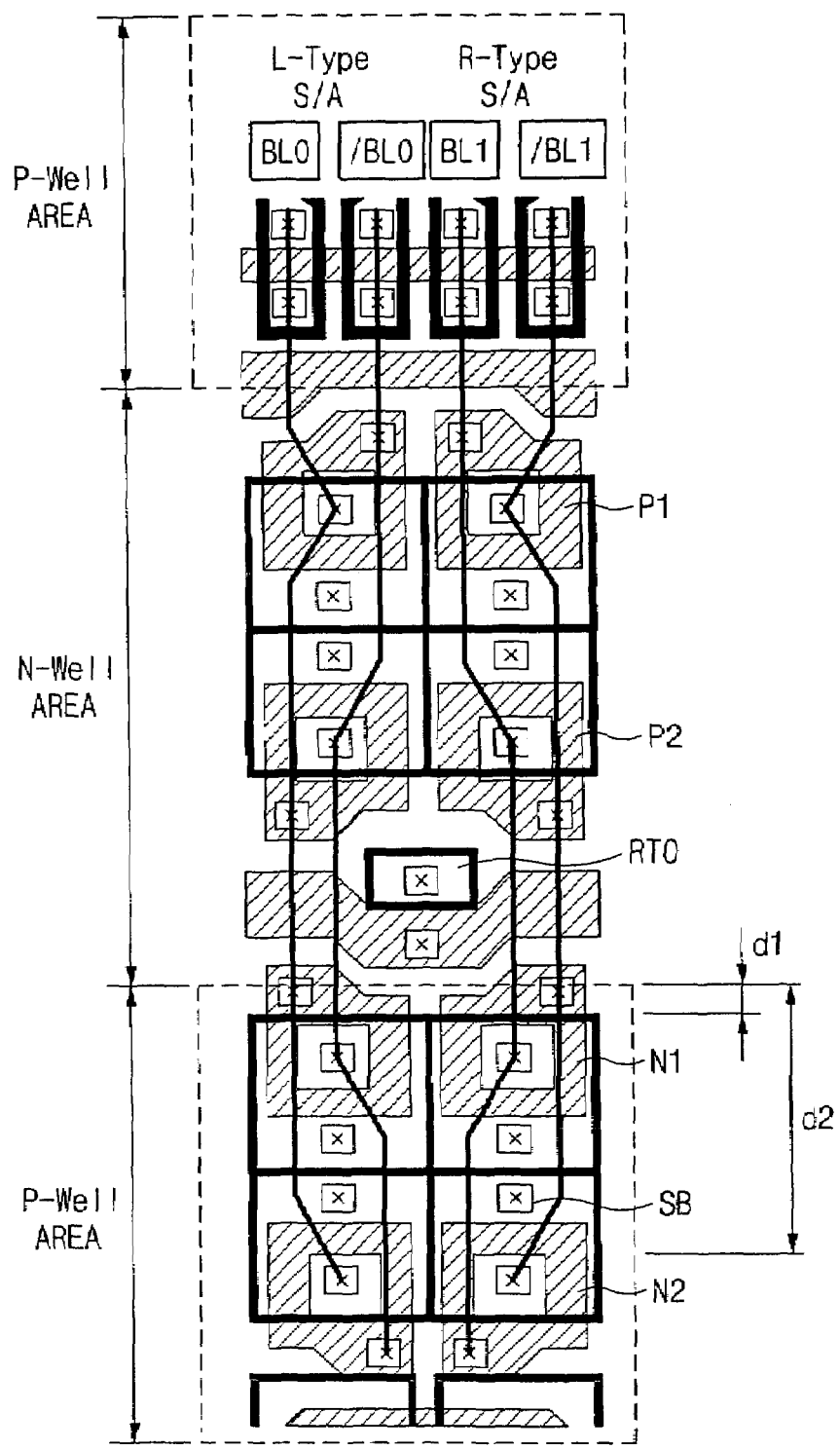
FIG. 1 is a circuit layout diagram illustrating the connection relation ship in a conventional bit line sense amplifier.
Figure 2:
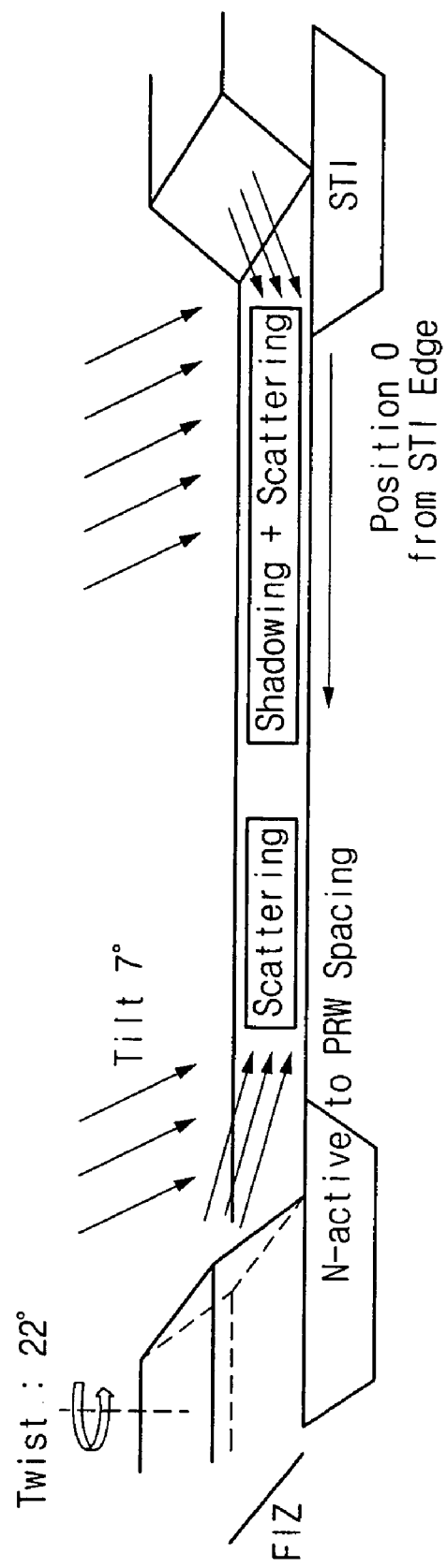
FIG. 2 is a diagram illustrating one cause to differentiate a threshold voltage VT depending on location of a device in a well.
Figure 3:
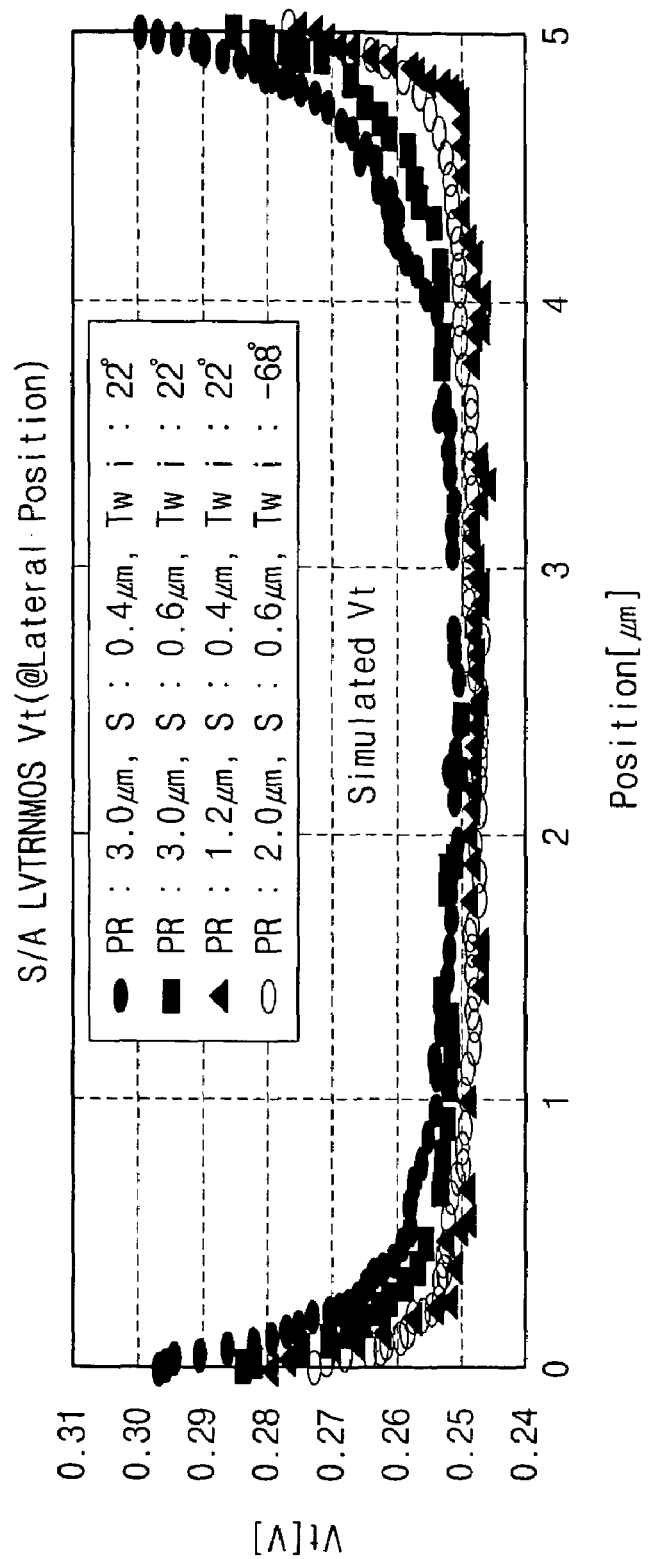
FIG. 3 is a diagram illustrating a simulation result that shows a difference of a local threshold voltage VT of a device depending on location in a well.
Figure 4:
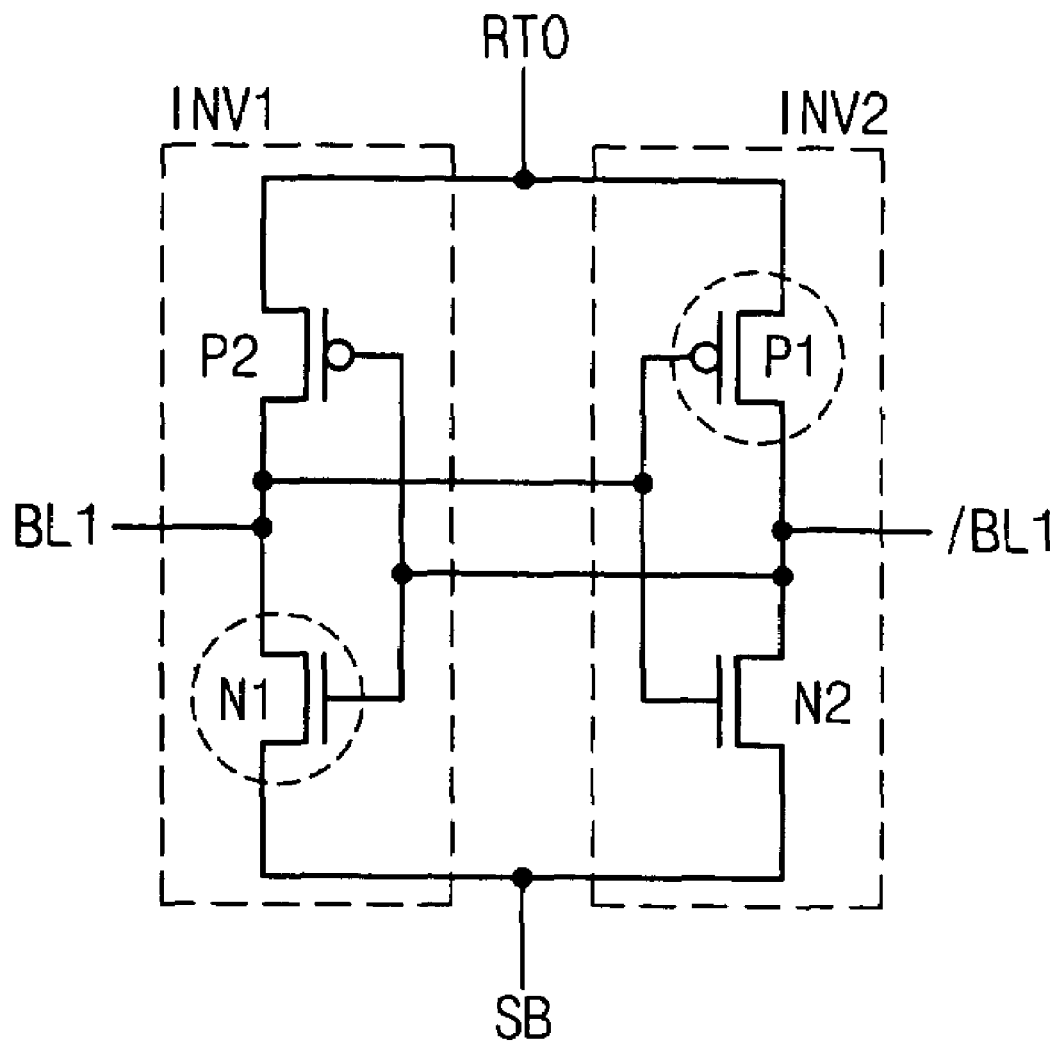
FIG. 4 is a circuit diagram illustrating the bit line sense amplifier of FIG. 1.

Referring to FIG. 5, while PMOS transistors P1 and P2 of a N-well region are the same as those of FIG. 1, FIG. 5 is different from FIG. 1 in arrangement and connection of gates and drains of NMOS transistors N1 and N2 in a P-well region.

That is, while the bit line BL1 of FIG. 1 is connected to the gate of the NMOS transistor N2 through the drain of the NMOS transistor N1, a bit line BL1 of FIG. 5 is connected to a drain of a NMOS transistor N2 through a gate of a NMOS transistor N1.

Additionally, while the bit line bar /BL1 of FIG. 1 is connected to the drain of the NMOS transistor N2 through the gate of the NMOS transistor N1, the bit line bar /BL1 of FIG. 5 is connected to a gate of the NMOS transistor N2 through a drain of the NMOS transistor N1.

Therefore, change in location of the gates of the NMOS transistors N1 and N2 is required in the bit line sense amplifier according to an embodiment of the present invention as shown in FIG. 5.

Figure 6:
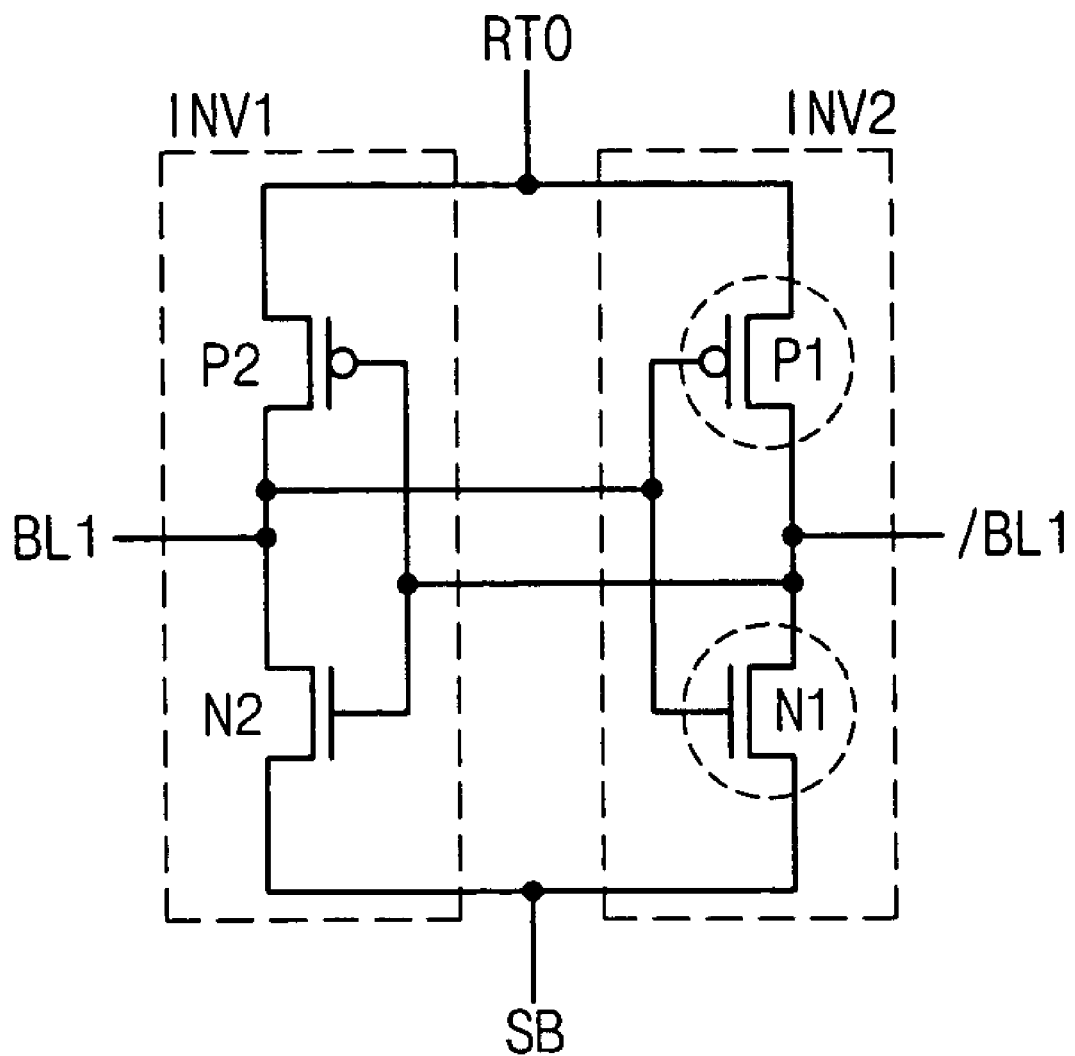
FIG. 6 is a circuit diagram illustrating the bit line sense amplifier of FIG. 5.

FIG. 6 is a circuit diagram illustrating the bit line sense amplifier of FIG. 5.

Referring to FIG. 6, an inverter INV1 is comprised of devices P2 and N2 apart from the edge of a well, and an inverter INV2 is comprised of devices P1 and N1 adjacent to the edge of the well.

In this way, when the inverter INV2 is comprised of the devices P1 and N1 having a large threshold voltage VT value, which are located adjacent to the edge of the well, a logic threshold voltage of the inverter INV1 is not changed, and an increase effect in threshold voltages VT of the NMOS transistor N1 and the PMOS transistor N1 in the inverter INV2 is offset. In other words, in case of the bit line bar /BL1 node of the inverter INV2, current leaked into the NMOS transistor N1 is decreased due to increase of the threshold voltage VT of the NMOS transistor N1, and simultaneously current flowed into the PMOS transistor P1 is lowered due to increase of the threshold voltage VT of the PMOS transistor P1, so that characteristic change of the inverter INV2 is minimized.

As a result, since the characteristic change of the inverters INV1 and INV2 due to characteristic inconsistency resulting from the location difference in devices is remarkably reduced in the bit line sense amplifier according to an embodiment of the present invention, a offset voltage is scarcely changed.

Figure 7:
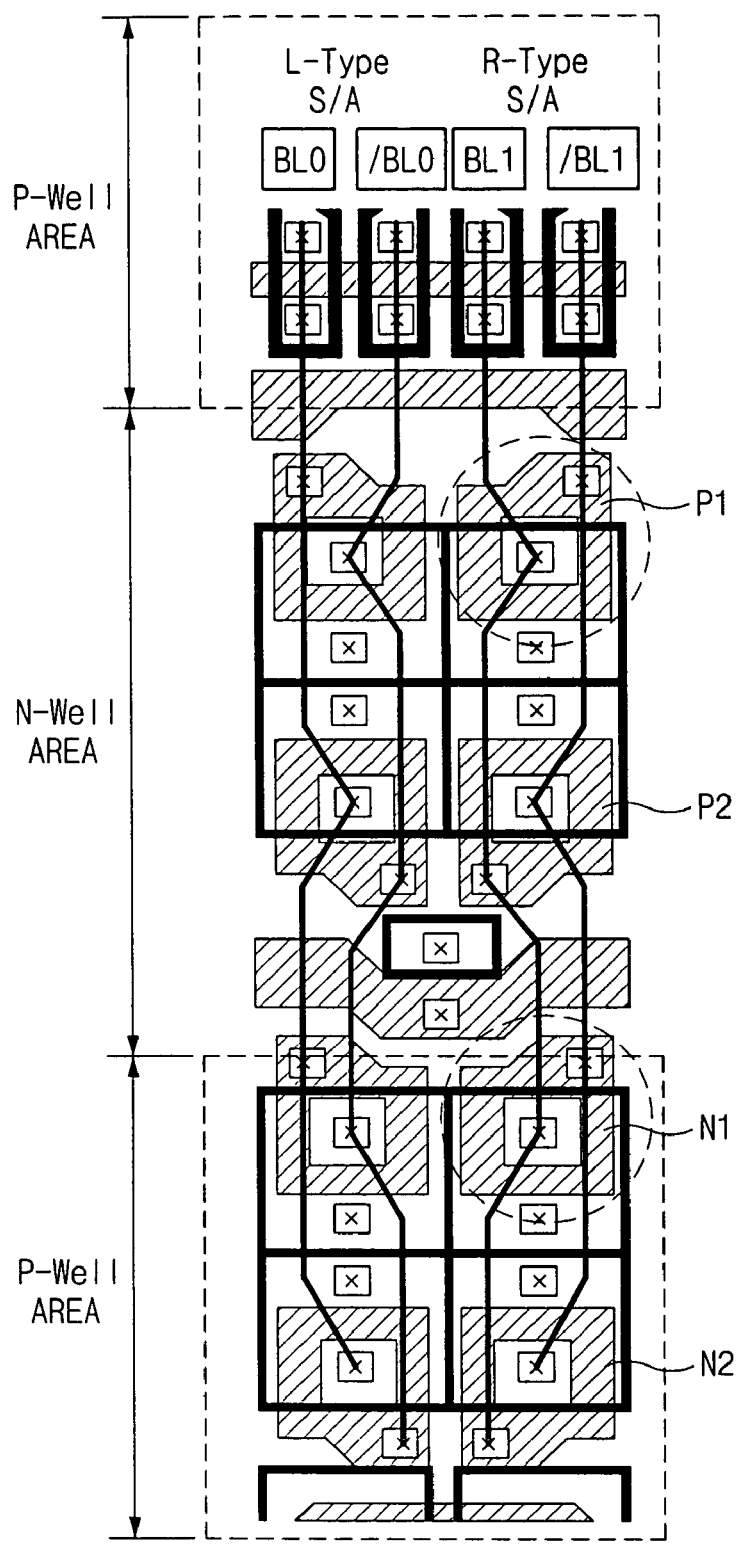
FIG. 7 is a circuit layout diagram illustrating a connection state of a bit line sense amplifier according to another embodiment of the present invention.

FIG. 7 is a circuit layout diagram illustrating a connection state of a bit line sense amplifier according to another embodiment of the present invention.

While the arrangement and connection of the gates and drains of the NMOS transistors N1 and N2 are changed without change of the connection state of the PMOS transistors P1 and P2 in the above-described first embodiment, arrangement and connection of gates and drains of PMOS transistors P1 and P2 is changed without change of connection of NMOS transistors N1 and N2 in the second embodiment.

That is, in a N-well region, a bit line BL1 is connected to a gate of a PMOS transistor P2 through a drain of a PMOS transistor P1, and a bit line bar /BL1 is connected to a drain of the PMOS transistor P2 through a gate of the PMOS transistor P1.

As shown in FIG. 7, change in location of gates of the PMOS transistors P1 and P2 is required in the bit line sense amplifier according to the second embodiment of the present invention.

Figure 8:
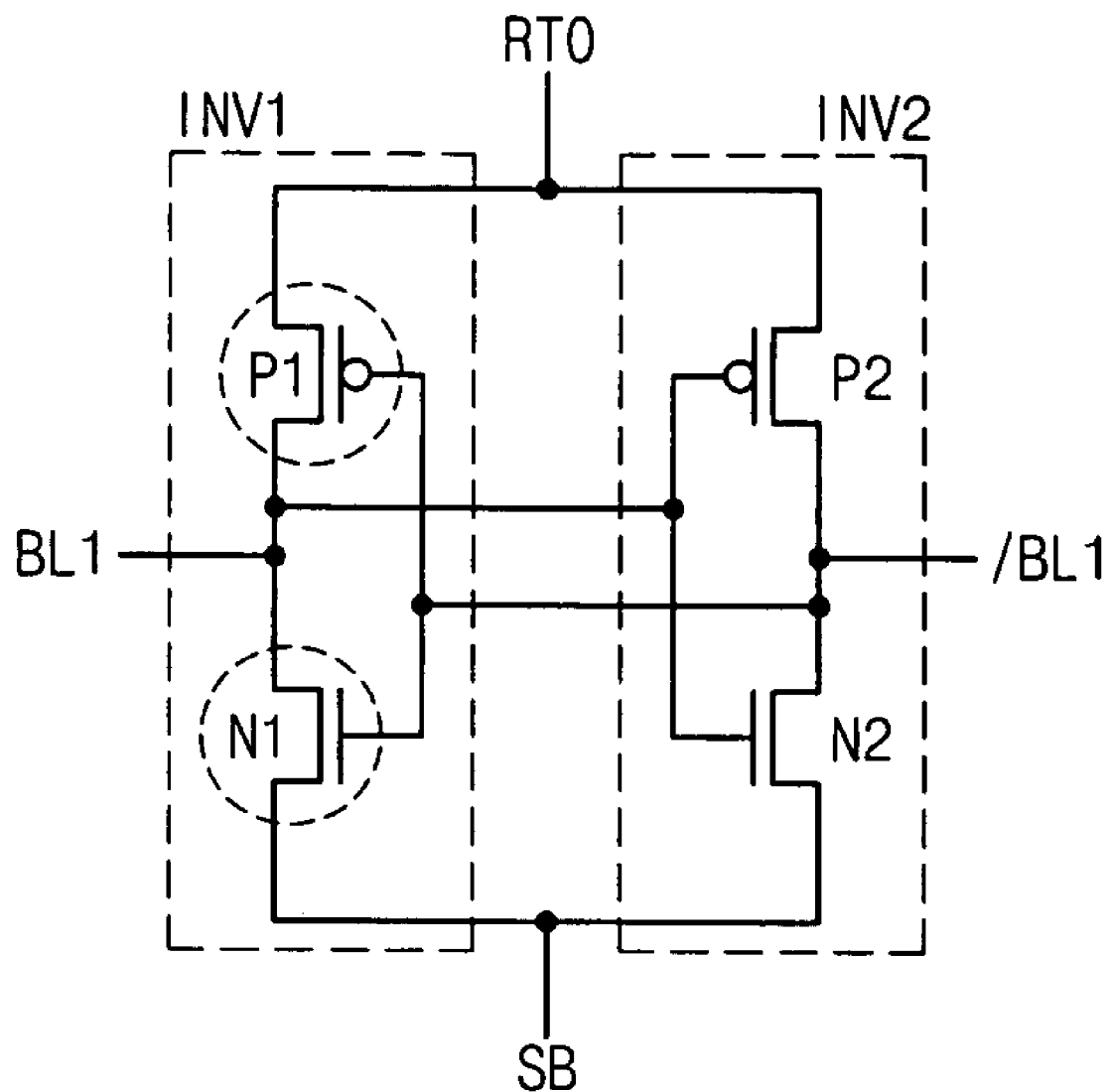
FIG. 8 is a circuit diagram illustrating the bit line sense amplifier of FIG. 7.

FIG. 8 is a circuit diagram illustrating the bit line sense amplifier of FIG. 7.

Referring to FIG. 8, an inverter INV1 is comprised of devices P1 and N1 adjacent to the edge of a well, and an inverter INV2 is comprised of devices P2 and N2 apart from the edge of the well.

A logic threshold voltage of the inverter INV2 is not changed, and an increase effect of threshold voltages VT of the NMOS transistor N1 and the PMOS transistor N1 in the inverter INV1 is offset.

As discussed earlier, in a bit line sense amplifier according to an embodiment of the present invention, since arrangement and connection of the devices are improved, increase of an offset voltage due to inconsistency of electrical characteristics which results from difference in location of devices is inhibited, thereby improving sensitivity of the sense amplifier and characteristics of the DRAM.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A bit line sense amplifier for inhibiting increase of an offset voltage, the bit line sense amplifier which senses and amplifies and latches data in paired bit lines, comprising:

a plurality of CMOS inverters, which are cross-coupled corresponding to the paired bit lines, for sensing and amplifying a voltage of the paired bit lines, wherein one of the cross-coupled CMOS inverters comprises first transistors which are formed at the edge of each well region where the first transistors are located, and the other of the cross-coupled CMOS inverters comprises second transistors which are formed at the center of each well region where the second transistors are located.

2. The bit line sense amplifier according to claim 1, wherein a first bit line of the paired bit lines is sequentially connected to a gate of a first PMOS transistor positioned at the edge of a N-well, to a drain of a second PMOS transistor formed at the middle of the N-well adjacent to the first PMOS transistor, to a gate of a first NMOS transistor formed at the edge of a P-well, and to a drain of a second NMOS transistor formed at the middle of the P-well adjacent to the first NMOS transistor, and a second bit line of the paired bit lines is sequentially connected to a drain of the first PMOS transistor, to a gate of the second PMOS transistor, to a drain of the first NMOS transistor, and to a gate of the second NMOS transistor.

3. The bit line sense amplifier according to claim 1, wherein a first bit line of the paired bit lines is connected to a drain of a first PMOS transistor formed at the edge of a N-well, to a gate of a second PMOS transistor formed at the middle of the N-well adjacent to the first PMOS transistor, to a drain of a first NMOS transistor formed at the edge of a P-well, and to a gate of a second NMOS transistor formed at the middle of the P-well adjacent to the first NMOS transistor, and a second bit line of the paired bit lines is connected to a gate of the first PMOS transistor, to a drain of the second PMOS transistor, to a gate of the first NMOS transistor, and to a drain of the second NMOS transistor.

* * * * *